(12) United States Patent
Horak et al.

(10) Patent No.: US 8,354,751 B2
(45) Date of Patent: Jan. 15, 2013

(54) INTERCONNECT STRUCTURE FOR ELECTROMIGRATION ENHANCEMENT

(75) Inventors: David V. Horak, Essex Junction, VT (US); Shom Ponoth, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 319 days.

(21) Appl. No.: 12/139,704

(22) Filed: Jun. 16, 2008

(65) Prior Publication Data

US 2009/0309226 A1    Dec. 17, 2009

(51) Int. Cl.
*H01L 23/48* (2006.01)
*H01L 23/52* (2006.01)
*H01L 29/40* (2006.01)

(52) U.S. Cl. ......... 257/767; 257/E23.151; 257/E23.142; 257/751; 257/752; 257/761; 257/762; 257/763; 257/770

(58) Field of Classification Search ................... 257/767, 257/751, 752, 761, 762, 763, 770
See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 6,287,977 B1 * | 9/2001 | Hashim et al. | 438/722 |
| 6,323,554 B1 | 11/2001 | Joshi et al. | |
| 6,326,671 B1 * | 12/2001 | Nagano et al. | 257/486 |
| 6,342,733 B1 | 1/2002 | Hu et al. | |
| 6,350,685 B1 * | 2/2002 | Asahina et al. | 438/660 |
| 6,479,391 B2 * | 11/2002 | Morrow et al. | 438/706 |
| 6,607,977 B1 * | 8/2003 | Rozbicki et al. | 438/627 |
| 6,642,146 B1 * | 11/2003 | Rozbicki et al. | 438/687 |
| 6,664,640 B2 * | 12/2003 | Kohno | 257/774 |
| 6,706,625 B1 | 3/2004 | Sudijono et al. | |
| 6,940,173 B2 * | 9/2005 | Cohen et al. | 257/758 |
| 6,969,911 B2 * | 11/2005 | Abe | 257/751 |
| 6,987,322 B2 * | 1/2006 | Chen et al. | 257/758 |
| 6,991,709 B2 * | 1/2006 | Gopalraja et al. | 204/192.3 |
| 7,064,044 B2 * | 6/2006 | Chen et al. | 438/401 |
| 7,217,655 B2 | 5/2007 | Cabral, Jr. et al. | |
| 7,241,696 B2 * | 7/2007 | Clevenger et al. | 438/722 |
| 7,247,946 B2 | 7/2007 | Bruley et al. | |

(Continued)

FOREIGN PATENT DOCUMENTS

JP        2006-510195        3/2006

(Continued)

OTHER PUBLICATIONS

European Search Report dated Nov. 26, 2009.

(Continued)

*Primary Examiner* — David Zarneke (74) *Attorney, Agent, or Firm* — Shimokaji & Assoc., PC (57) ABSTRACT

An interconnect structure having enhanced electromigration resistance is provided in which a lower portion of a via opening includes a multi-layered liner. The multi-layered liner includes, from a patterned surface of a dielectric material outwards, a diffusion barrier, a multi-material layer and a metal-containing hard mask. The multi-material layer includes a first material layer comprised of residue from an underlying dielectric capping layer, and a second material layer comprised of residue from an underlying metallic capping layer. The present invention also provides a method of fabricating such an interconnect structure which includes the multi-layered liner within a lower portion of a via opening formed within a dielectric material.

12 Claims, 7 Drawing Sheets

U.S. PATENT DOCUMENTS

| | | | |
|---|---|---|---|
| 7,307,344 B2 * | 12/2007 | Minamihaba et al. | 257/758 |
| 7,335,588 B2 * | 2/2008 | Yang et al. | 438/638 |
| 7,402,519 B2 * | 7/2008 | He et al. | 438/687 |
| 7,482,261 B2 * | 1/2009 | Yang | 438/619 |
| 7,745,282 B2 * | 6/2010 | Yang et al. | 438/250 |
| 2003/0114004 A1 | 6/2003 | Sato et al. | |
| 2004/0113279 A1 | 6/2004 | Chen et al. | |
| 2004/0115921 A1 | 6/2004 | Clevenger | |
| 2004/0235237 A1 | 11/2004 | Inoue et al. | |
| 2005/0042871 A1 * | 2/2005 | Tzou et al. | 438/689 |
| 2005/0146034 A1 * | 7/2005 | Andreyushchenko et al. | 257/751 |
| 2006/0024941 A1 | 2/2006 | Son et al. | |
| 2006/0264030 A1 | 11/2006 | Fujiki | |
| 2007/0077761 A1 | 4/2007 | Lehr et al. | |
| 2007/0152341 A1 | 7/2007 | Hwang et al. | |
| 2007/0184655 A1 | 8/2007 | Learn et al. | |
| 2007/0205482 A1 | 9/2007 | Yang et al. | |
| 2007/0246075 A1 | 10/2007 | Garcia et al. | |
| 2007/0292615 A1 | 12/2007 | Dordi et al. | |
| 2008/0057698 A1 | 3/2008 | Ishigami | |
| 2008/0251928 A1 * | 10/2008 | Chang et al. | 257/762 |
| 2009/0014877 A1 * | 1/2009 | Chang et al. | 257/751 |

FOREIGN PATENT DOCUMENTS

| | | |
|---|---|---|
| JP | 2006-324584 | 11/2006 |
| JP | 2007-142033 | 6/2007 |
| JP | 2008-060243 | 3/2008 |
| JP | 2009-510771 | 3/2009 |
| JP | 2009-528702 | 8/2009 |

OTHER PUBLICATIONS

Japan Office Action dated Jan. 18, 2010.

* cited by examiner

INTERCONNECT STRUCTURE FOR ELECTROMIGRATION ENHANCEMENT

FIELD OF THE INVENTION

The present invention relates to a semiconductor structure and a method of fabricating the same. More particularly, the present invention relates to an interconnect structure having enhanced electromigration (EM) resistance by lining a lower region of a via opening with a multi-layered liner. The present invention also provides a method of fabricating such an interconnect structure.

BACKGROUND OF THE INVENTION

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction to the bottom of the interconnect, which eventually results in a circuit dead opening.

Figure 1A:
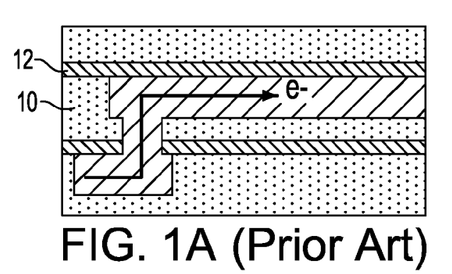
FIGS. 1A-1D are pictorial representations (through cross sectional views) illustrating the formation of a dead circuit in a prior interconnect structure which is caused by EM failure.
Figure 1B:
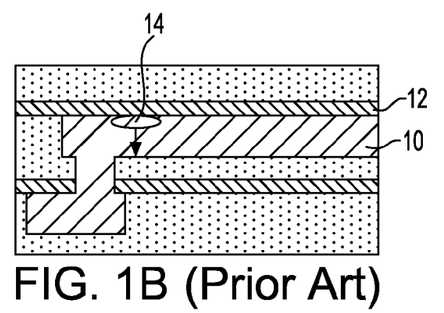
Figure 1C:
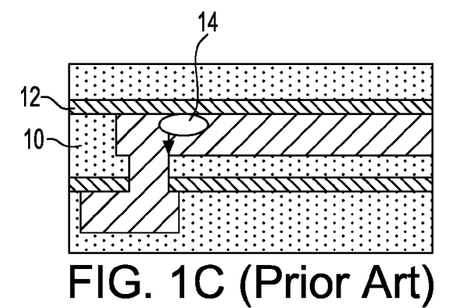
Figure 1D:
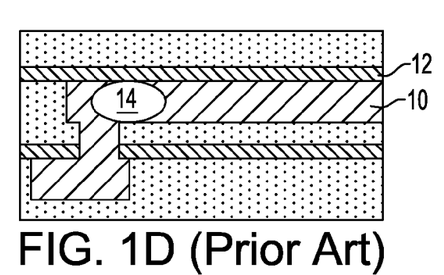

FIGS. 1A-1D are pictorial representations of a prior art interconnect structure at various stages of an EM failure. In these drawings, reference numeral 12 denotes the dielectric cap, and reference numeral 10 denotes the metal interconnect feature; all other components of the prior art interconnect structure are not labeled to avoid obscuring the EM problem. FIG. 1A is at an initial stress stage. FIG. 1B is at a time when void 14 nucleation initiates at the metal interconnect feature 10/dielectric cap 12 interface. FIG. 1C is at a time when the void 14 grows towards the bottom of the conductive feature 10, and FIG. 1D is at a time in which the void 14 growth crosses the metal interconnect feature 10 causing a circuit dead opening.

It has been demonstrated that by replacing the Cu/dielectric interface with a Cu/metal interface can enhance electromigration resistance by greater than 100×. Prior art metal caps are typically comprised of a Co-containing alloy such as, for example, CoWP, which is selectively deposited atop of the Cu conductor region of the interconnect structure. One problem with utilizing such selective deposited metal caps is that during a clean in dilute hydrofluoric acid, which is generally used to clean the surface of the interconnect dielectric material, corrosion of metal caps may occur. This is particularly observed when CoWP is used as the metal cap material. In particular, dilute hydrofluoric acid etches out some of the metal cap causing the formation of voids within the interconnect structure. The voids are present in an area of the interconnect structure in which an overlying conductively filled via comes into contact with an underlying conductive region of a metal capped lower interconnect level. The presence of voids caused by etching out the metal cap using dilute hydrofluoric acid is unwanted since it decreases the EM resistance of the interconnect structure.

In view of the above, there is a need for providing an interconnect structure which avoids a circuit dead opening caused by EM failure, while also avoiding the formation of voids caused by etching out a metal capping layer.

SUMMARY OF THE INVENTION

The present invention provides an interconnect structure having enhanced electromigration resistance in which a lower portion of a via opening includes a multi-layered liner. The multi-layered liner includes, from the surface of a patterned dielectric material outwards, a diffusion barrier, a multi-material layer and a metal-containing hard mask. The multi-material layer includes a first material layer comprised of residue from an underlying dielectric capping layer, and a second material layer comprised of residue from an underlying metallic capping layer. The interconnect structure of the present invention also avoids the formation of voids caused by etching out a metal capping layer. As such, the inventive interconnect structure has better reliability and technology extendibility as compared to prior art interconnect structures.

The present invention also provides a method of fabricating such an interconnect structure which includes the multi-layered liner within a lower portion of a via opening formed within a dielectric material.

In general terms, the interconnect structure includes:
a lower interconnect level including a first dielectric material having at least one conductive feature embedded therein, said at least one conductive feature having a via gouging feature located therein;
a patterned metallic capping layer located atop some, but not all, portions of the at least one conductive feature;
a patterned dielectric capping layer located atop the patterned metallic capping layer and portions of the first dielectric material; and
an upper interconnect level including a second dielectric material having at least one conductively filled line located atop and connected to an underlying conductively filled via, wherein a lower portion of said conductively filled via located in proximity to the patterned dielectric capping layer includes a multi-layered liner comprising, from a patterned surface of the second dielectric material outwards, a diffusion barrier, a multi-material layer and a metal-containing hard mask, said multi-material layer includes a first material layer comprised of residue from said patterned dielectric capping layer, and a second material layer comprised of residue from said patterned metallic capping layer.

In addition to the interconnect structure mentioned above, the present invention also provides a method of fabricating the same. The method of the present invention includes processing steps that are compatible with existing semiconductor interconnect processing steps.

In general terms, the method of the present invention includes:

providing a structure including a first dielectric material having at least one conductive feature embedded therein, a metallic capping layer located on a surface of said at least one conductive feature, a dielectric capping layer located on a surface of the metallic capping layer and portions of the first dielectric material, a second dielectric material located on a surface of said dielectric capping layer, and a hard mask located on a surface of said dielectric capping layer;

forming at least one via opening through said hard mask and said second dielectric material, stopping on said surface of the dielectric capping layer;

forming a diffusion barrier at least within said at least one via opening and located on sidewalls of the second dielectric material and on an exposed surface of said dielectric capping layer;

forming a via gouging feature within said at least one conductive feature embedded within the first dielectric material by removing portions of said diffusion barrier, said dielectric capping layer and said metallic capping layer, wherein during said forming the via gouging feature a multi-material layer is formed at a bottom portion of said at least one via opening, said multi-material layer includes a first material layer comprised of residue from said dielectric capping layer, and a second material layer comprised of residue from said metallic capping layer;

forming a metal-containing hard mask at least within said via opening;

forming at least one line opening that is located atop and in contact with said at least one via opening;

forming another diffusion barrier within said at least one line opening and said at least one via opening; and forming an interconnect conductive material within said via gouging feature, said at least one via opening and said at least one line opening, said interconnect conductive material having an upper surface that is coplanar to an upper surface of said second dielectric material.

DETAILED DESCRIPTION OF THE INVENTION

The present invention, which provides an interconnect structure having enhanced electromigration (EM) reliability and a method of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides an interconnect structure having enhanced electromigration resistance in which a lower portion of a via opening includes a multi-layered liner. The multi-layered liner, which improves the electromigration resistance of the inventive structure, includes, from a vertical surface of a patterned dielectric material outwards, a diffusion barrier, a multi-material layer and a metal-containing hard mask. The multi-material layer includes a first material layer comprised of residue from an underlying dielectric capping layer, and a second material layer comprised of residue from an underlying metallic capping layer. The present invention also provides a method of fabricating such an interconnect structure which includes the multi-layered liner within a lower portion of a via opening formed within a dielectric material.

Reference is now made to FIGS. 2A-2L which are pictorial representations (through cross sectional views) depicting the basic processing steps employed in one embodiment of the present invention. Specifically, this embodiment of the invention begins by providing the initial structure 50 structure, illustrated in FIG. 2A. As shown, the initial structure 50 includes a first interconnect level 52 of an interconnect structure comprising a first dielectric material 54 having a least one conductive feature 58 embedded therein which is separated from the first dielectric material 54 by a first diffusion barrier 56. The initial structure 50 shown in FIG. 2A also includes a metallic capping layer 60 disposed on an exposed upper surface of the at least one conductive feature 58; some of the first metallic capping layer 60 may extend onto the first diffusion barrier 56, but it does not extend onto the surface of the first dielectric material 54.

Figure 2A:
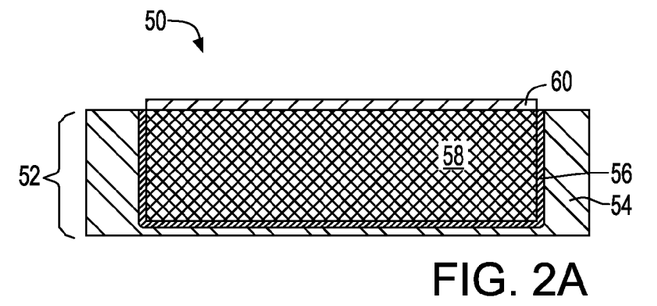
FIGS. 2A-2L are pictorial representations (through cross sectional views) depicting the basic processing steps of the present invention.

The initial structure 50 shown in FIG. 2A is typically located on a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 54 comprises any interlevel or intralevel dielectric including inorganic dielectrics or organic dielectrics. The first dielectric material 54 may be porous or non-porous. Some examples of suitable dielectrics that can be used as the first dielectric material 54 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 54 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 54 may vary depending upon the dielectric material used as well as the exact number of dielectrics within the layer. Typically, and for normal interconnect structures, the first dielectric material 54 has a thickness from about 200 to about 450 nm.

The first dielectric material 54 is formed on the substrate (not shown) utilizing any conventional deposition process including, for example, chemical vapor deposition (CVD), plasma enhanced chemical vapor deposition (PECVD), evaporation, chemical solution deposition and spin-on coating.

Following the formation of the first dielectric material 54 on a substrate (not shown), the first dielectric material 54 is patterned by lithography (applying a photoresist, exposing the applied photoresist to a desired pattern of radiation and development) and etching (dry etching, wet etching or a combination thereof) to provide at least one opening within the first dielectric material 54 in which the at least one conductive feature (i.e., the conductive material 58) will be subsequently formed. The patterning of the first dielectric material 54 may occur with a hard mask (not shown) located on the upper surface of the first dielectric material 54. The hard mask (not shown) is typically removed after filling the at least one opening with a conductive material and subjecting the structure to planarization. During the etching process, the patterned photoresist can be removed (via a conventional stripping process) after transferring the pattern into at least the hard mask. The hard mask may include an oxide, nitride, oxynitride or multilayered combinations thereof, e.g., an oxide/nitride hard mask.

Next, a first diffusion barrier 56 is formed on the exposed wall portions of the first dielectric material 54 within the at least one opening. The first diffusion barrier 56 comprises one of Ta, TaN, TiN, Ru, RuN, RuTa, RuTaN, W, WN and any other material that can serve as a barrier to prevent conductive material from diffusing there through. The thickness of the first diffusion barrier 56 may vary depending on the deposition process used in forming the same as well as the material employed. Typically, the first diffusion barrier 56 has a thickness from about 4 to about 40 nm, with a thickness from about 7 to about 20 nm being more typical.

The first diffusion barrier 56 is formed by a conventional deposition process including, for example, CVD, PECVD, atomic layer deposition (ALD), physical vapor deposition (PVD), sputtering, chemical solution deposition and plating.

After lining the opening with the first diffusion barrier 56, at least one conductive feature 58 is formed within the opening by depositing a conductive material within the opening and planarizing the structure. The planarization provides a structure in which the upper surface of at least the conductive feature 58 is substantially coplanar with an upper surface of the first dielectric material 54.

The conductive feature 58 includes, for example, polySi, a conductive metal, an alloy comprising at least one conductive metal, a conductive metal silicide or combinations thereof. Preferably, the conductive feature 58 is a conductive metal such as Cu, W or Al, with Cu or a Cu alloy (such as AlCu) being highly preferred in the present invention. The conductive material used in forming the conductive feature 58 is filled into the remaining portions of the least one opening in the first dielectric material 54 utilizing a conventional deposition process including, but not limited to: CVD, PECVD, sputtering, chemical solution deposition or plating.

After deposition, a conventional planarization process such as, for example, chemical mechanical polishing (CMP) and/or grinding can be used to provide a structure in which the first diffusion barrier 56 and the conductive feature 58 each have an upper surface that is substantially coplanar with the upper surface of the first dielectric material 54.

Next, a metallic capping layer 60 is formed on the upper exposed surface of at least the conductive feature 58 within the first dielectric material 54. The metallic capping layer 60 comprises Co, Ir or Ru alone, or their alloy materials with at least one of W, B, P, Mo and Re. That is, one of Co, Ir and Ru with at least one of W, B, P, Mo and Re. Preferably, the metallic capping layer 60 comprises a Co-containing metallic capping layer, with CoWP being highly preferred. The metallic capping layer 60 has a thickness that is typically within a range from about 2 to about 20 nm, with a thickness range from about 5 to about 10 nm being even more typical.

The metallic capping layer 60 is typically, but not necessary always, formed utilizing a selective deposition process including for example, a catalytic plating process and an electroless plating process. In some embodiments, a non-selective deposition process such as sputtering, atomic layer deposition (ALD) and CVD can be used.

It is observed that the metallic capping layer 60 is not coplanar to an upper surface of the first dielectric material 54. Instead, the metallic capping layer 60 has an upper surface that is located above the upper surface of the first dielectric material 54. As such, the conductive feature 58 is not a recessed conductive feature.

Figure 2B:
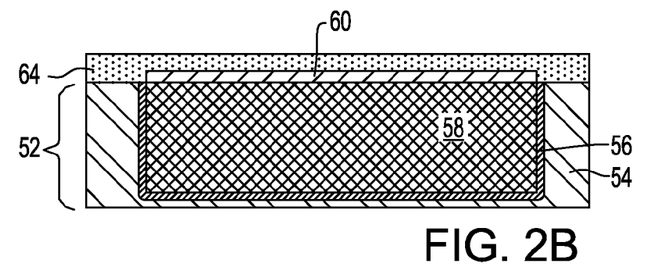

FIG. 2B shows the resultant structure that is formed after a dielectric capping layer 64 is formed. The dielectric capping layer 64 covers the upper exposed surface of the first dielectric material 54 as well as the metallic capped conductive feature (that is, the dielectric capping layer also located atop the metallic capping layer 60).

The dielectric capping layer 64 is formed utilizing a conventional deposition process such as, for example, CVD, PECVD, and spin-on coating. The dielectric capping layer 64 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the dielectric capping layer 64 may vary depending on the technique used to form the same as well as the material make-up of the layer. Typically, the dielectric capping layer 64 has a thickness from about 15 to about 55 nm, with a thickness from about 25 to about 45 nm being more typical.

Figure 2C:
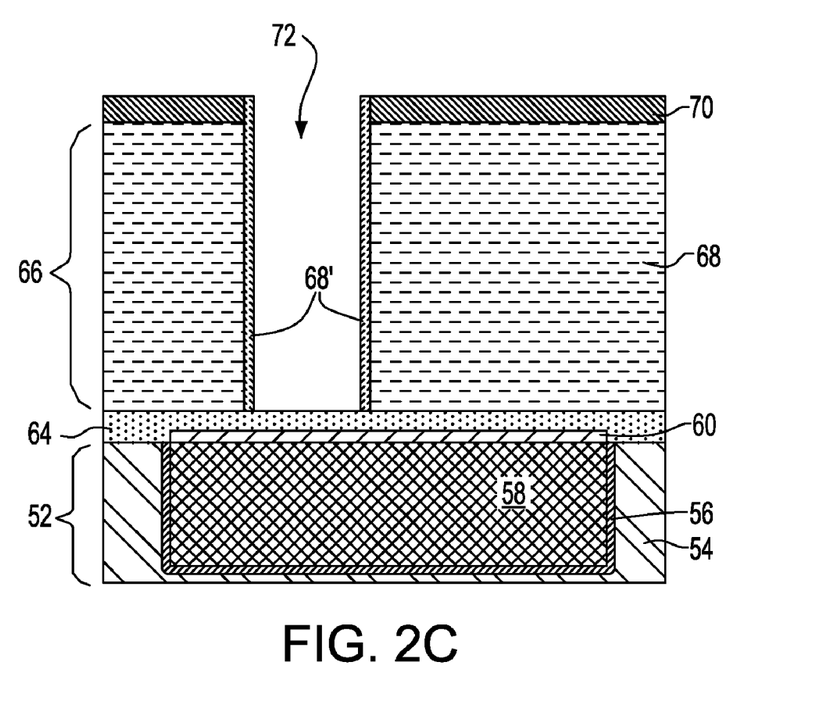

Next, and as shown in FIG. 2C, a second dielectric material 68, which forms part of a second interconnect level 66 of the inventive structure, is formed on the upper exposed surface of the dielectric capping layer 64. The second dielectric material 68 may comprise the same or different, preferably the same, dielectric material as that of the first dielectric material 54. The processing techniques and thickness ranges for the first dielectric material 54 are also applicable here for the second dielectric material 68. The second dielectric material 68 can also comprise two different materials, i.e., deposition of one dielectric material first, followed by deposition of a different dielectric material. In one embodiment of the present invention, the second dielectric material 68 comprises two different low k dielectric materials and thus the second interconnect level 66 has a hybrid structure with the subsequently filled conductively filled line embedded in a porous dielectric material, and the subsequently filled via embedded in a dense (i.e., non porous) dielectric material. In such an embodiment, the porous low k dielectric has a dielectric constant of about 2.8 or less, and the dense porous low k dielectric has a dielectric constant of about 4.0 or less.

After forming the second dielectric material 68 on the dielectric capping layer 64, a hard mask 70, such as shown in FIG. 2C as well, is formed on the upper surface of the second dielectric material 68. The hard mask 70 comprises an oxide, nitride, oxynitride or multilayered stacks thereof. In one embodiment, the hard mask 70 is comprised of silicon oxide. In another embodiment, the hard mask 70 is comprised of silicon nitride. In yet another embodiment of the present invention, the hard mask 70 is comprised of a pad stack comprising a layer of silicon oxide, and a layer of silicon nitride located atop the layer of silicon oxide. The hard mask 70 can be formed utilizing a thermal growth process including, for example, oxidation, nitridation and combinations thereof. Alternatively, the hard mask 70 can be formed by a deposition process including, for example, chemical vapor deposition, plasma enhanced chemical vapor deposition, chemical solution deposition, atomic layer deposition and evaporation.

The thickness of the as-deposited hard mask 70 may vary depending upon the type of hard mask material formed, the number of layers that make up the hard mask and the deposition technique used in forming the same. Typically, the as-deposited hard mask 70 has a thickness from about 10 to about 80 nm, with a thickness from about 20 to about 60 nm being even more typical.

The structure shown in FIG. 2C also depicts the presence of a via opening 72 that extends from the upper surface of the hard mask 70 through the second dielectric material 68 stopping on an upper surface of dielectric capping layer 64. The via opening 72 is formed utilizing lithography and etching. The lithographic step used in forming the via opening 72 comprises applying a photoresist (not shown) atop the surface of the hard mask 70, exposing the photoresist to a desired pattern, i.e., a via pattern, of radiation, and developing the photoresist. The via pattern within the developed photoresist is transferred first to the hard mask 70 and then into the second dielectric material 68 by utilizing one or more etching processes. The patterned photoresist can be stripped immediately after the pattern is transferred into the hard mask 70 forming a patterned hard mask utilizing a conventional stripping process. Alternatively, the patterned photoresist can be stripped after the pattern is transferred into the second dielectric material 68. The etching used in transferring the pattern may comprise a dry etching process, a wet chemical etching process or a combination thereof. The term "dry etching" is used herein to denote an etching technique such as reactive-ion etching, ion beam etching, plasma etching or laser ablation.

It should be observed that the present invention only shows one via opening and one conductive feature within the first dielectric material for illustrative purposes only. Although a single via opening and a single conductive feature within the first dielectric material is shown, the present invention is not limited to the same. Instead, a plurality of via openings and conductive features is contemplated by the present invention.

It is further observed that during the formation of the via opening 72 into the second dielectric material 68 the sidewalls of the second dielectric material 68 are damaged forming damaged sidewalls 68'. The damaged sidewalls 68' are also depicted, for example, in FIG. 2C. The damaged sidewalls 68' are less dense as compared to the bulk material. This could be either chemical or physical in nature. For example, and when the second dielectric material 68 includes C as one of the atoms, the damaged sidewalls 68' of the second dielectric material 68 have a lower C content (i.e., C depletion) as compared to the remaining portions of the second dielectric material 68. When non-C containing dielectric materials are employed, the damaged sidewalls 68' may be characterized as being porous.

Next the structure shown in FIG. 2C is subjected to a cleaning step which removes the damaged layer 68' from the sidewalls of the second dielectric material 68 within the via opening 72. The resultant structure which is formed after performing the cleaning step is shown, for example, in FIG. 2D. The cleaning process employed in the present invention comprises any cleaning process which is capable of removing the damaged sidewalls 68' of the structure shown in FIG. 2C. Examples of such cleaning processes that are capable of removing the damaged sidewalls 68' from within the via opening 72 include a wet clean such as contacting with DHF (i.e., dilute hydrofluoric acid) or DI (i.e., deionized water), a dry clean such as contacting with a gas or plasma of $NH_3$, $N_2$, $H_2$ or silane, and any combination thereof. Preferably, contacting with DHF is employed. The cleaning process has good removing selectivity between damaged dielectric and bulk dielectric (>100:1).

Figure 2D:
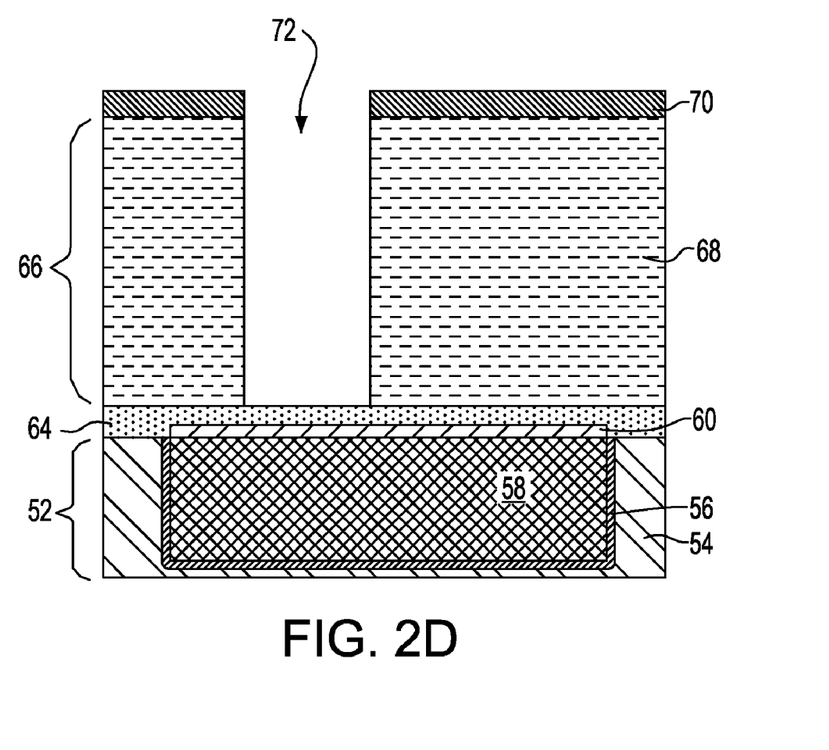
Figure 2E:
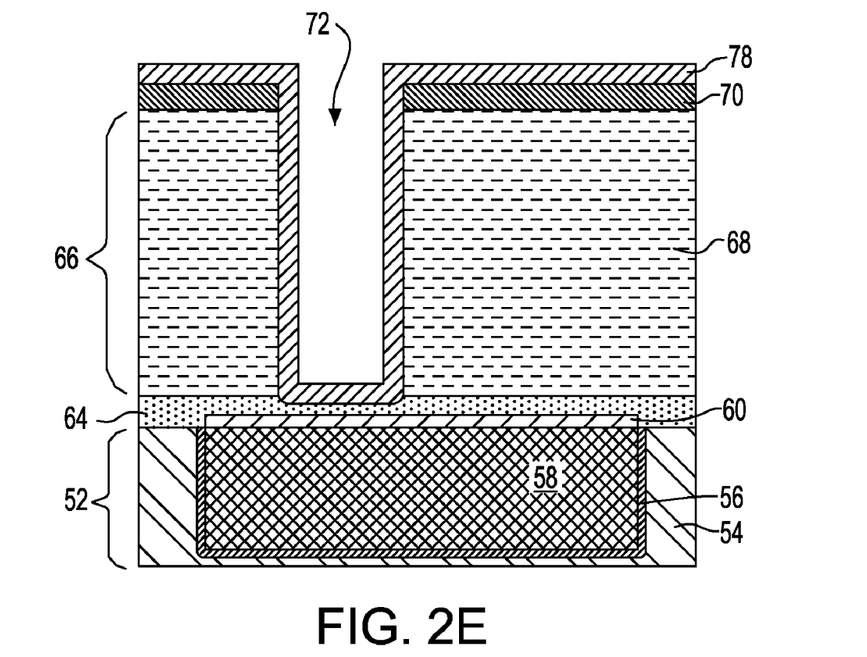

FIG. 2E illustrates the structure of FIG. 2D after a second diffusion barrier 78 is formed on all exposed surfaces (horizontal and vertical) of the structure shown in FIG. 2D. In accordance with the present invention, the second diffusion barrier 78 comprises Ta, TaN, Ti, TiN, Ru, RuN, RuTa, RuTaN, W, WN or any other material that can serve as a barrier to prevent a conductive material from diffusing therethrough. Combinations of these materials are also contemplated forming a multilayered stacked diffusion barrier. The second diffusion barrier 78 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the second diffusion barrier 78 may vary depending on the number of material layers within the barrier, the technique used in forming the same as well as the material of the diffusion barrier itself. Typically, the second diffusion barrier 78 has a thickness from about 4 to about 40 nm, with a thickness from about 7 to about 20 nm being even more typical.

Figure 2F:
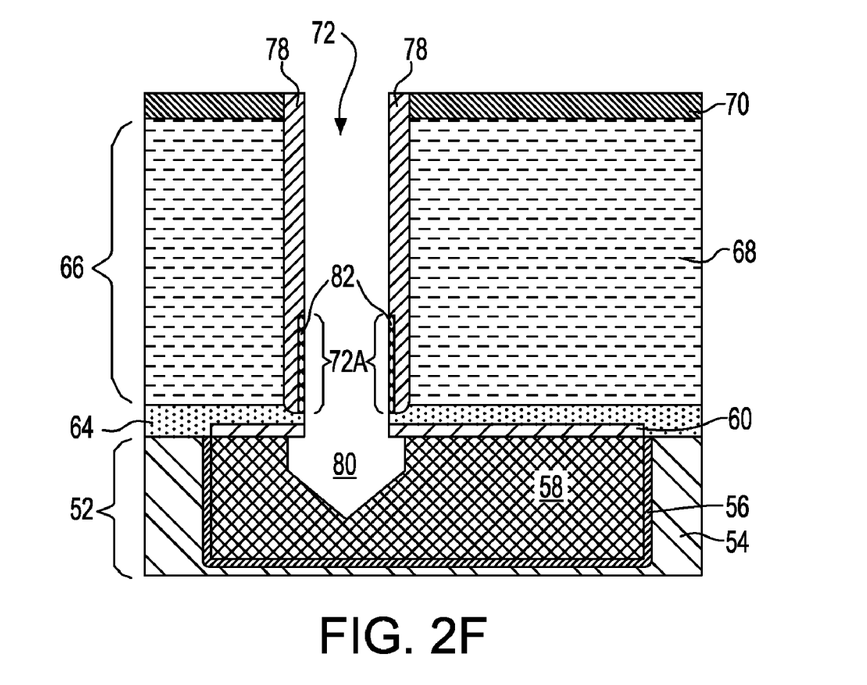

Next, a via gouging feature 80 such as shown, for example, in FIG. 2F is formed into the conductive feature 58 within the first dielectric material 54. The structure shown in FIG. 2F is formed utilizing an Ar sputtering process that punches through to the underlying conductive material 58 (i.e., by removing a portion of the second diffusion barrier 78, the dielectric capping layer 64 and the metallic capping layer 60 that lies within the bottom of the via opening 72 as well as a portion of the conductive material 58 within the conductive feature 58) so as to create a via gouging feature (or anchoring area) within the conductive feature 58. The Ar sputtering process utilized in forming the via gouging feature comprises any conventional Ar sputtering process that is typically used in interconnect technology to form such a feature. By way of illustration, Ar sputtering can be performed utilizing the following non-limiting conditions: gas flow of 20 sccm Ar, temperature of 25° C., bias of top electrode of 400 KHz and 750 W, table bias of 13.6 MHz and 400 W, and a process pressure of 0.6 mtorr. While Ar is shown for purpose of illustration, any other gas such as He, Ne, Xe, $N_2$, $H_2$, $NH_3$, $N_2H_2$, or mixtures thereof, can also be used for the gaseous sputtering process.

Figure 3:
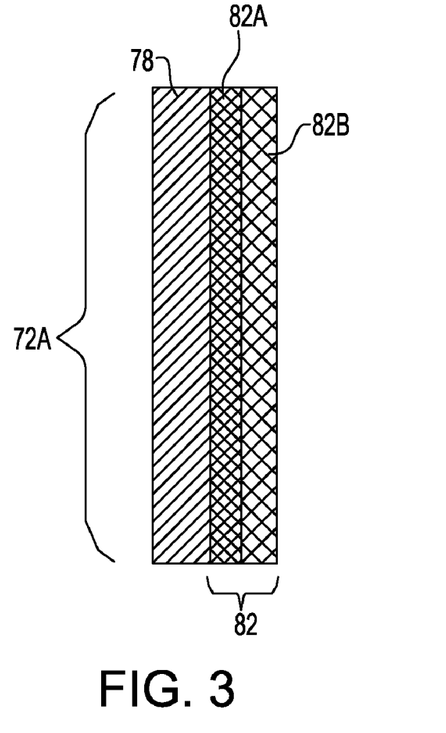
FIG. 3 is a pictorial representation (through a cross sectional view) that illustrates a close up view of liner materials at the lower portion of the via opening sidewall formed in the structure illustrated in FIG. 2F.

During the formation of the via gouging feature, residues from the sputtering process form on the sidewalls of second diffusion barrier 78 in a lower portion 72A of the via opening 72. Specifically, the residues provide a multi-material layer 82 on sidewalls of second diffusion barrier 78 in a lower portion 72A of the via opening 72 that includes a first material layer 82A comprised of residue from the dielectric capping layer 64 abutting the sidewalls of the remaining second diffusion barrier 78 within the lower portion 72A of the via opening 72, a second material layer 82B comprised of residue from the metallic capping layer 60 abutting the first material layer 82A. It is observed that FIG. 2F shows only the multi-material layer as a single layer for clarity, while FIG. 3, which is an expanded view of a segment of the lower portion of the via including the multi-material layer, shows both layers of the multi-material layer that is formed at this point of the invention.

In a preferred embodiment of the present invention, the first material layer 82A comprises atoms of at least silicon and nitrogen. In another preferred embodiment of the present invention, the second material layer 82B comprises atoms of at least Co, Ir, and Ru.

In some embodiments (not shown), a metallic interfacial layer can be selectively formed on the exposed upper surface of the remaining conductive material 58 within the via gouging feature. The metallic interfacial layer is formed utilizing any conventional deposition process including, for example, CVD, PECVD, chemical solution deposition, evaporation, metalorgano deposition, ALD, or plating (electroless or electro). The thickness of the metallic interfacial layer may vary depending on the exact metallic interfacial material used as well as the deposition technique that was used in forming the same. Typically, the metallic interfacial layer has a thickness from about 0.5 to about 40 nm, with a thickness from about 1 to about 10 nm being even more typical. The metallic interfacial layer comprises a metallic barrier material such as, for example, Co, TaN, Ta, Ti, TiN, Ru, Ir, Au, Rh, Pt, Pd or Ag. Alloys of such materials are also contemplated.

Figure 2G:
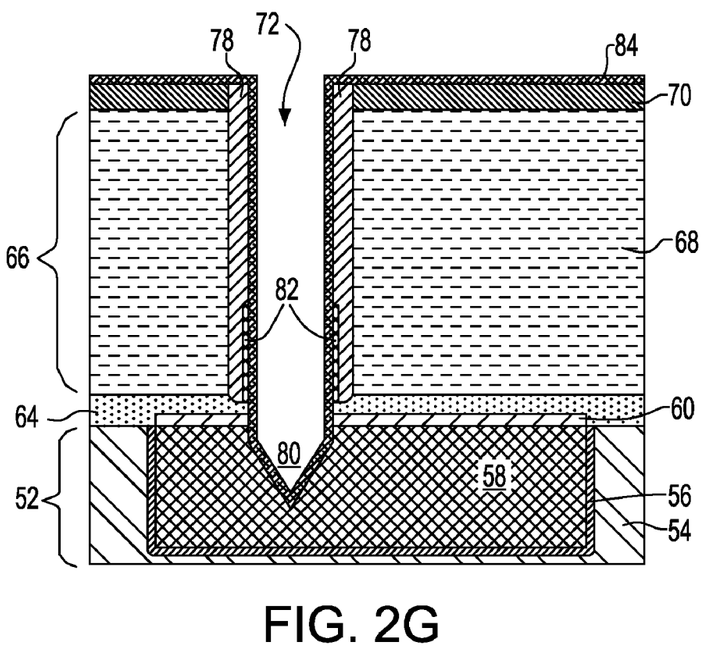

FIG. 2G shows the structure after a metal-containing hard mask 84 is formed on all exposed surfaces of the structure shown in FIG. 2F. The metal-containing hard mask 84 comprises any diffusion barrier metal including, for example, one of Ru, Ta, W and Ti.

The metal-containing hard mask 84 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the metal-containing hard mask 84 may vary depending on the technique used in forming the same as well as the metal of the metal-containing hard mask 84 itself. Typically, the metal-containing hard mask 84 has a thickness from about 1 to about 40 nm, with a thickness from about 2 to about 10 nm being even more typical.

Figure 2H:
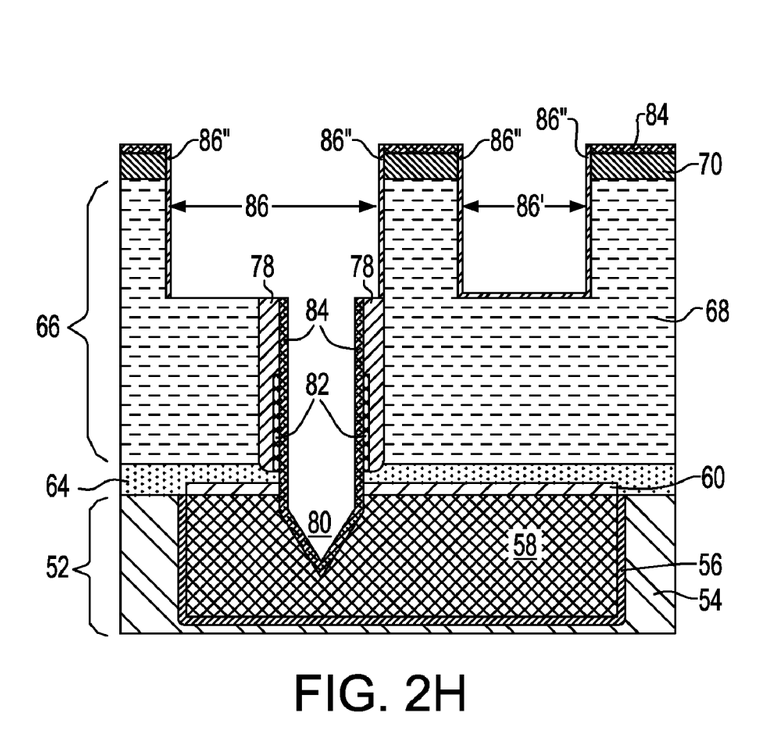

Next, and as shown within FIG. 2H, at least one line opening 86 is formed within the second dielectric material 68 which is located atop and connected to the via opening 72. Line opening 86' can also be formed as shown. The line openings 86, 86' are formed by first providing a planarization material (not shown) within the via opening 72. The planarization material is first deposited filling the via opening 72 utilizing a conventional deposition process including, for example, CVD, PECVD, spin-on coating, evaporation or chemical solution deposition. The planarization material includes a conventional antireflective coating material or a spun-glass material. The planarization material completes fills the via opening 72 as well as extending above the via opening 72 on either the metal-containing hard mask 84 or the exposed surface of the hard mask 70. In addition to the planarization material, a hard mask (not shown) is disposed on a surface of the planarization material and a patterned photoresist (not shown) is disposed on a surface of the hard mask. The hard mask and patterned photoresist are formed utilizing conventional processing including those mentioned above. It is observed that the patterned photoresist (not shown) contains an opening that has the width of a line opening. The structure is then subjected to one or more etching processes which are capable of forming the structure shown in FIG. 2H. As shown in this figure, the one or more etching processes form line openings 86, 86' in the second dielectric material 68. The one or more etching steps remove, in sequential order, exposed portions of the hard mask, the underlying portions of the planarization material and exposed portions of the second dielectric material 68. The patterned photoresist and the patterned hard mask and a portion of the metal-containing hard mask 84 are typically consumed during the mentioned etching steps. Next, the remaining planarization material is removed from the via opening 72 utilizing either a chemical wet etching process or a chemical ashing process that is selective in removing the planarization material from the structure.

It is further observed that during the formation of the line openings 86, 86' into the second dielectric material 68 the sidewalls of the second dielectric material 68 are again damaged forming damaged sidewalls 68". The damaged sidewalls 68" are also depicted, for example, in FIG. 2H. The damaged sidewalls 68" are less dense as compared to the bulk material. This could be either chemical or physical in nature. For example, and when the second dielectric material 68 includes C as one of the atoms, the damaged sidewalls 68" of the second dielectric material 68 have a lower C content (i.e., C depletion) as compared to the remaining portions of the second dielectric material 68. When non-C containing dielectric materials are employed, the damaged sidewalls 68" may be characterized as being porous.

Figure 2I:
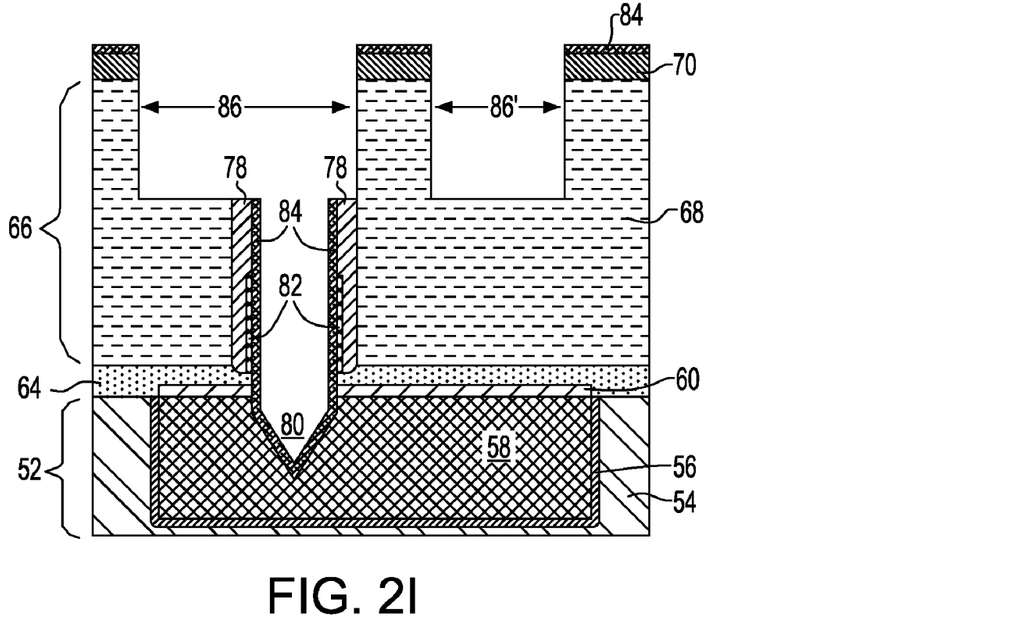

FIG. 2I shows the resultant structure that is formed after subjecting the structure shown in FIG. 2H to a cleaning step which removes the damaged layer 68" from the sidewalls of the second dielectric material 68 within the line opening 86,

86". The cleaning process employed in the present invention comprises any cleaning process which is capable of removing the damaged sidewalls 68" of the structure. Examples of such cleaning processes that are capable of removing the damaged sidewalls 68" from within the line opening 86, 86' include a wet clean such as contacting with DHF (i.e., dilute hydrofluoric acid) or DI (i.e., deionized water), a dry clean such as contacting with a gas or plasma of $NH_3$, $N_2$, $H_2$ or silane, and any combination thereof. Preferably, contacting with DHF is employed. The cleaning process has good removing selectivity between damaged dielectric and bulk dielectric (>100:1), and does not remove the remaining metal-containing hard mask 84.

At this point of the invention, the remaining metal-containing hard mask 84 atop the hard mask 70 may be removed utilizing a conventional stripping process that stops on hard mask 70. Alternatively, the remaining metal-containing hard mask can be removed during a planarization process that follows the filling of the line openings, the via openings and the via gouging feature. In the remaining drawings, the metal-containing hard mask 84 atop hard mask 70 is shown as being removed from the structure for sake of clarity.

Figure 2J:
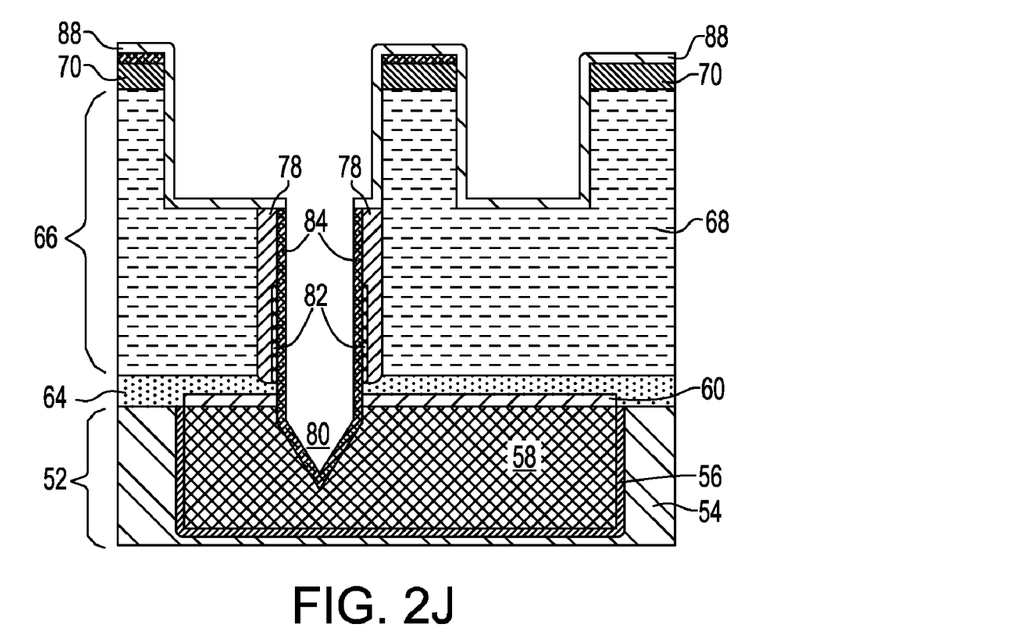

FIG. 2J illustrates the structure of FIG. 2I after a third diffusion barrier 88 is formed on all exposed surfaces (horizontal and vertical) of the line opening 86, 86' as well atop hard mask 70 shown in FIG. 2I. In accordance with the present invention, the third diffusion barrier 88 may comprise the same or different, preferably the same, diffusion material as the second diffusion barrier 78. Typically, the third diffusion barrier 88 comprises Ta, TaN, Ti, TiN, Ru, RuN, RuTa, RuTaN, W, WN or any other material that can serve as a barrier to prevent a conductive material from diffusing therethrough. Combinations of these materials are also contemplated forming a multilayered stacked diffusion barrier. The third diffusion barrier 88 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the third diffusion barrier 88 may vary depending on the number of material layers within the barrier, the technique used in forming the same as well as the material of the diffusion barrier itself. Typically, the third diffusion barrier 88 has a thickness from about 4 to about 40 nm, with a thickness from about 7 to about 20 nm being even more typical.

In some embodiments, an adhesion/plating seed layer (not specifically shown) is also formed atop the third diffusion barrier 88; in embodiments when the adhesion/plating seed layer is used, reference numeral 88 shown in FIG. 2J represents a material stack including both the third diffusion barrier and the optional adhesion/plating seed layer. When employed, the optional adhesion/plating seed layer is comprised of a metal or metal alloy from Group VIIIA of the Periodic Table of Elements. Examples of suitable Group VIIIA elements for the adhesion/plating seed layer include, but are not limited to Ru, TaRu, Ir, Rh, Pt, Pd and alloys thereof. In some embodiments, it is preferred to use Ru, Ir or Rh as the optional adhesion/plating seed layer. The optional adhesion/plating seed layer is formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the optional adhesion/plating seed layer may vary depending on number of factors including, for example, the compositional material of the adhesion/plating seed layer and the technique that was used in forming the same. Typically, the optional adhesion/plating seed layer has a thickness from about 0.5 to about 10 nm, with a thickness of less than 6 nm being even more typical.

Figure 2K:
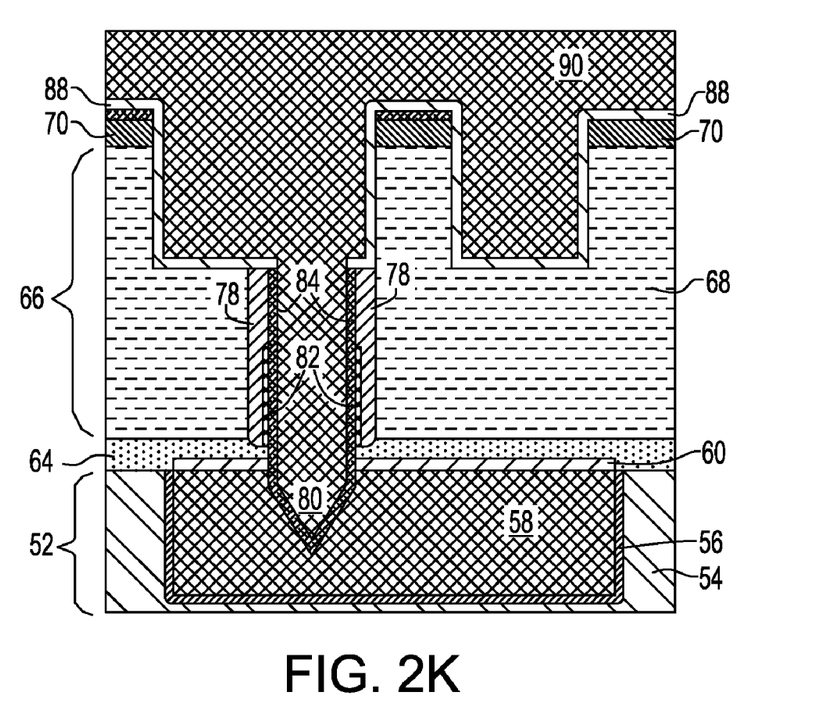

Reference is now made to FIG. 2K which illustrates the structure of FIG. 2J after filling the via and line openings as well as the via gouging feature 80 with an interconnect conductive material 90. The interconnect conductive material 90 may comprise the same or different, preferably the same, conductive material as the conductive feature 58 (with the proviso that the conductive material is not polysilicon) within the first dielectric material 54. Preferably, Cu, Al, W or alloys thereof are used, with Cu or AlCu being most preferred. The interconnect conductive material 90 is formed utilizing the same deposition processing as described above in forming the conductive feature 58 within the first dielectric material 54.

After providing the structure shown in FIG. 2K, the structure is subjected to a conventional planarization process such as, for example, chemical mechanical planarization and/or grinding. The planarization process removes various materials that are located atop the second dielectric material 68 of the second interconnect level 66. The planarized structure is shown, for example, in FIG. 2L. It is noted that in FIG. 2L, the interconnect conductive material 90 and the third diffusion barrier 88, each have an upper surface that is coplanar with the second dielectric material 68.

Figure 2L:
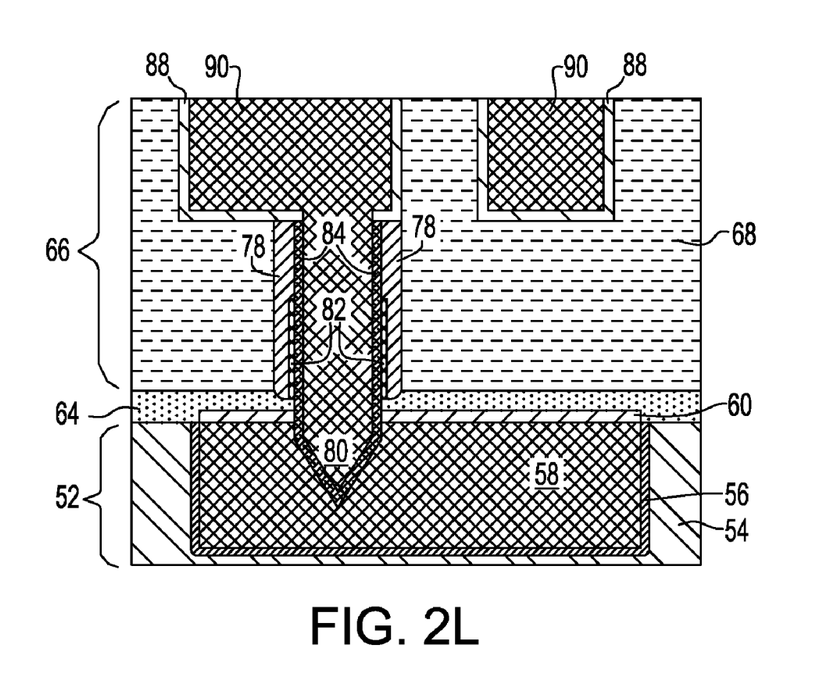

It is observed that the lower portion 72A of the via opening 72 in the structure shown in FIG. 2L includes a multi-layered liner that includes, from the patterned vertical surface of the second dielectric material 68 outwards, the second diffusion barrier 78, the multi-material layer 82 on sidewalls of second diffusion barrier 78 and the metal-containing hard mask 84. As stated above, the multi-material layer 82 includes a first material layer 82A comprised of residue from the dielectric capping layer 64 abutting the sidewalls of the remaining second diffusion barrier 78, and a second material layer 82B comprised of residue from the metallic capping layer 60 abutting the first material layer 82A. It is observed that FIG. 2L shows only the multi-material layer as a single layer for clarity, while FIG. 4, which is an expanded view of a segment of the lower portion of the via including the multi-material layer, shows both layers of the multi-material layer.

Figure 4:
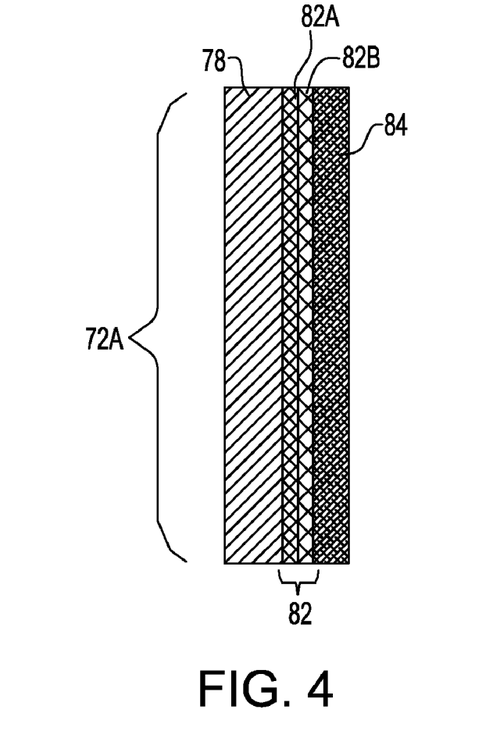
FIG. 4 is a pictorial representation (through a cross sectional view) that illustrates a close up view of liner materials at the lower portion of the via opening sidewall formed in the structure illustrated in FIG. 2L.

Is further observed that FIG. 4 illustrates the multi-layered liner of the present invention which includes the second diffusion barrier 78, the multi-material layer 82 and the metal-containing hard mask 84.

It is noted that the structure shown in FIG. 2L represents one embodiment of the present invention. In this embodiment of the present invention, a via gouging feature is formed into the conductive feature 58 within the first dielectric material 54.

Figure 5:
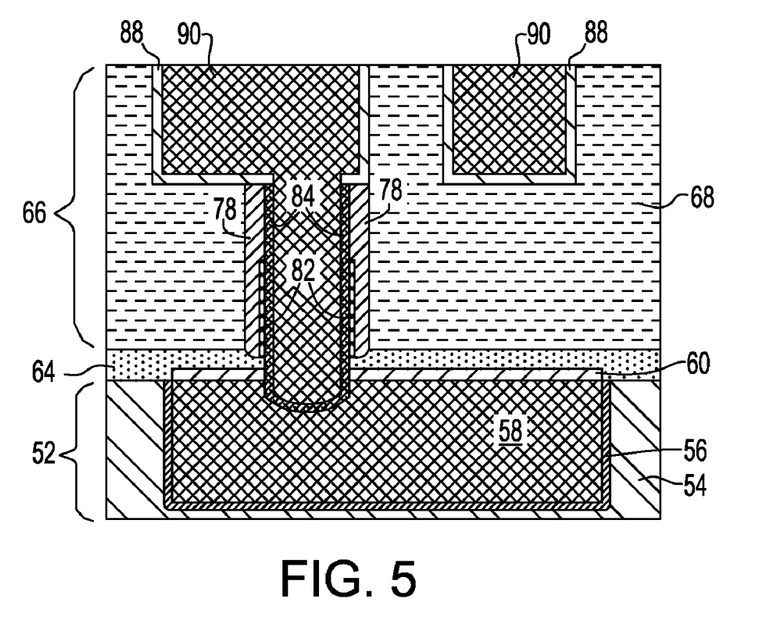
FIG. 5 is a pictorial representation (through a cross sectional view) illustrating another embodiment of the invention in which the via gouging feature is relatively flat as compared to the gouging feature represented in FIGS. 2A-2L.

Reference is now made to FIG. 5 which is a pictorial representation (through a cross sectional view) illustrating another embodiment of the invention in which the via gouging feature is relatively flat as compared to the via gouging feature represented in FIGS. 2A-2L. This structure is formed utilizing the same basic processing steps are described above in FIGS. 2A-2L except that milder conditions are used for the sputtering process. For example, the following sputtering conditions can be used to provide a flatter via gouging feature: same process condition as the one used for creating the via gouging feature with approximately 30% less process duration.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
a first interconnect level including a first dielectric material having at least one conductive feature embedded therein, said at least one conductive feature having a via gouging feature located therein;
a patterned metallic capping layer located atop some, but not all, portions of the at least one conductive feature;
a patterned dielectric capping layer located atop the patterned metallic capping layer and portions of the first dielectric material;
a second interconnect level including a second dielectric material having at least one conductively filled line embedded in a porous dielectric material located atop and connected to an underlying conductively filled via embedded in a non-porous third dielectric material,
wherein said first and second dielectric materials comprise the same porous low k dielectric,
wherein the metallic capping layer extends onto a first diffusion barrier without extending onto the first dielectric material,
wherein the first diffusion barrier lines at least one opening within the first dielectric material, and is affixed on an exposed wall portion of the first dielectric material, and
wherein a lower portion of said conductively filled via located in proximity to the patterned dielectric capping layer includes a multi-layered liner comprising:
a second diffusion barrier from a patterned surface of the second dielectric material outwards;
a multi-material layer including
a first material layer comprising residue from said patterned dielectric capping layer, and
a second material layer comprising residue from said patterned metallic capping layer; and
a hard mask comprising multilayered stacks of oxynitride; and
a third diffusion barrier formed on all exposed surfaces of the one opening within the first dielectric material and on top of the hard mask comprising a multilayered stack with at least one layer of tantalum, at least one layer of ruthenium, and at least one layer of titanium.

2. The semiconductor structure of claim 1 wherein:
said first and second dielectric materials comprise the same or different low k dielectric having a dielectric constant of about 4.0 or less;
the second diffusion barrier is in contact with the second dielectric materials, the multi-material layer being located on the sidewalls of the second diffusion barrier; and
the third diffusion barrier has an upper surface that is coplanar with the second dielectric materials.

3. The semiconductor structure of claim 1 wherein said first and second dielectric materials comprise the same or different porous low k dielectric having a dielectric constant of about 2.8 or less.

4. The semiconductor structure of claim 1 wherein said first and second dielectric materials are the same or different and comprise at least one of $SiO_2$, a silsesquioxane, a C doped oxide that include atoms of Si, C, O and H, and a thermosetting polyarylene ether.

5. The semiconductor structure of claim 1 wherein said patterned dielectric capping layer comprises one of SiC, $Si_4NH_3$, $SiO_2$, a carbon doped oxide, and a nitrogen and hydrogen doped silicon carbide SiC(N,H).

6. The semiconductor structure of claim 1 wherein said patterned metallic capping layer comprises one from the group consisting of Co, Ir and Ru in pure form or alloyed with at least one from the group consisting of W, B, P, Mo and Re.

7. The semiconductor structure of claim 6, wherein said patterned metallic capping layer is Co-containing.

8. The interconnect structure of claim 1 wherein said conductively filled line and said conductively filled and said via gouging feature are filled with the same interconnect conductive material.

9. The interconnect structure of claim 8 wherein said interconnect conductive material is comprised of Cu or a Cu-containing alloy.

10. The interconnect structure of claim 1 wherein said first material layer comprises atoms of silicon and nitrogen.

11. The interconnect structure of claim 1 wherein said second material layer comprises atoms selected from the group consisting of Co, Ir and Ru.

12. The interconnect structure of claim 1 wherein said metal-containing hard mask comprises one of Ru, Ta and Ti.